United States Patent [19]

Jeong

[11] Patent Number: 5,265,051
[45] Date of Patent: Nov. 23, 1993

[54] SEMICONDUCTOR MEMORY DEVICE HAVING AN INTERNAL SIGNAL DETECTOR

[75] Inventor: Hyoung-Seob Jeong, Seoul, Rep. of Korea

[73] Assignee: SamSung Electronics Co., Ltd., Suwon, Rep. of Korea

[21] Appl. No.: 775,559

[22] Filed: Oct. 15, 1991

[30] Foreign Application Priority Data

Jul. 31, 1991 [KR] Rep. of Korea ............... 13281

[51] Int. Cl.$^5$ ................ G11C 11/34; G11C 19/28
[52] U.S. Cl. ............... 365/189.05; 365/189.03; 365/189.12; 365/221
[58] Field of Search ........... 365/189.05, 203, 189.03, 365/189.12, 221

[56] References Cited

U.S. PATENT DOCUMENTS 5,022,001  6/1991  Kowalski et al. ............... 365/203

FOREIGN PATENT DOCUMENTS 3-37898  2/1991  Japan ............... 365/189.05

Primary Examiner—Eugene R. LaRoche
Assistant Examiner—Viet Q. Nguyen
Attorney, Agent, or Firm—Robert E. Bushnell

[57] ABSTRACT

An internal signal detector of a semiconductor memory device for detecting potential characteristics of internal signals representative of defective memory cells or circuits with an improved debugging operation having a plurality of first transfer transistors respectively tapped into a plurality of internal transmission lines connecting between the memory cells or circuits, for transferring selected internal signals in dependence upon a first control signal; a plurality of latch circuits respectively for latching potential characteristics of the selected internal signals; a plurality of second transfer transistors for transferring the latched potential characteristics of the selected signals in dependence upon a second control signal; and a shift register for transferring the latched potential characteristics of the selected internal signals to an exterior surface of the semiconductor memory device.

20 Claims, 3 Drawing Sheets

SEMICONDUCTOR MEMORY DEVICE HAVING AN INTERNAL SIGNAL DETECTOR

BACKGROUND OF THE INVENTION

The present invention relates to a semiconductor memory device, and more particularly to an internal signal detector for detecting any defects from each internal circuit in the semiconductor memory device.

Recently, there has been an increased demand for semiconductor memory devices that are capable of having high integration and high storage capacity. As semiconductor memory devices are increasingly integrated to obtain greater storage capacity, the number of defects among the memory circuits concomitantly increases to contribute to a low yield in the productivity of these semiconductor memory devices. In order to address problems of defects and low yield, the defect memory circuit of the semiconductor memory devices must be detected.

However, it is very difficult to detect the defective circuit or element thereof in a highly integrated semiconductor memory device over 1 mega byte or 4 mega byte. Moreover, even if the defects are detected, their detecting time is too long.

FIG. 1 shows an internal signal (or circuit) detector of a prior art. The circuit of FIG. 1 detects the defects of an internal signal by using a probing method. The probing method is used to detect the defects and to check the potential characteristic by erecting a probe on a transistor or a pad of the integrated circuit. First and second signal generators 3 and 4 in the chip generate the signals indicating the operational characteristic of circuits or elements thereof in a chip. Although the circuit of FIG. 1 comprises two signal generators, a plurality of signal generators can be included also. First and second probes 1 and 2 are located on the surface of chip, to detect the internal signal signifying the defective element of the chip. In the following, the detecting operation of the internal signal signifying the defective elements of the chip will be described. The first and second transmission probes 1 and 2 are erected on lines connecting the first signal generator 3 and the second signal generator 4; the transmission lines receive signals $S_1$ and $S_2$ generated by the first and second signal generators 3 and 4. Thereafter, whether the signals $S_1$ and $S_2$ detected between the first and second signal generators 3 and 4 are normal or not is checked by operation of the first and second probes 1 and 2. However, this process, i.e., to obtain the potential value of each node through the physical or electrical probing operation, takes a considerably long debugging time in order to detect the defects. Further, since the higher density is provided to the integrated circuit, the internal circuit becomes more complicated. Accordingly the debugging time increases substantially.

SUMMARY OF THE INVENTION

It is therefore an object of the invention to provide a semiconductor memory device which can reduce a debugging operation time.

In accordance with the present invention, the semiconductor memory device having a plurality of first and second signal generators, which are connected by given transmission lines to each other, comprises an internal signal detector including a plurality of latch circuits, connected to the lines, for latching the voltages applied to the transmission lines, and a plurality of registers connected to the latch circuits, for producing the voltages latched onto the latch circuits to the exterior surface of a chip. The internal signal detector can easily be arranged on the vacant space in the chip.

BRIEF DESCRIPTION OF THE DRAWINGS

These and other objects of this invention will become apparent to those skilled in the art upon consideration of the accompanying drawing, in which.

DETAILED DESCRIPTION OF THE PREFERRED EMBODIMENT

Figure 1:
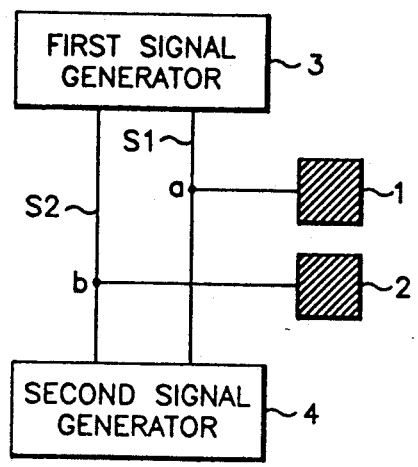
FIG. 1 shows a block diagram illustrating an internal signal detector of a prior art.
Figure 2:
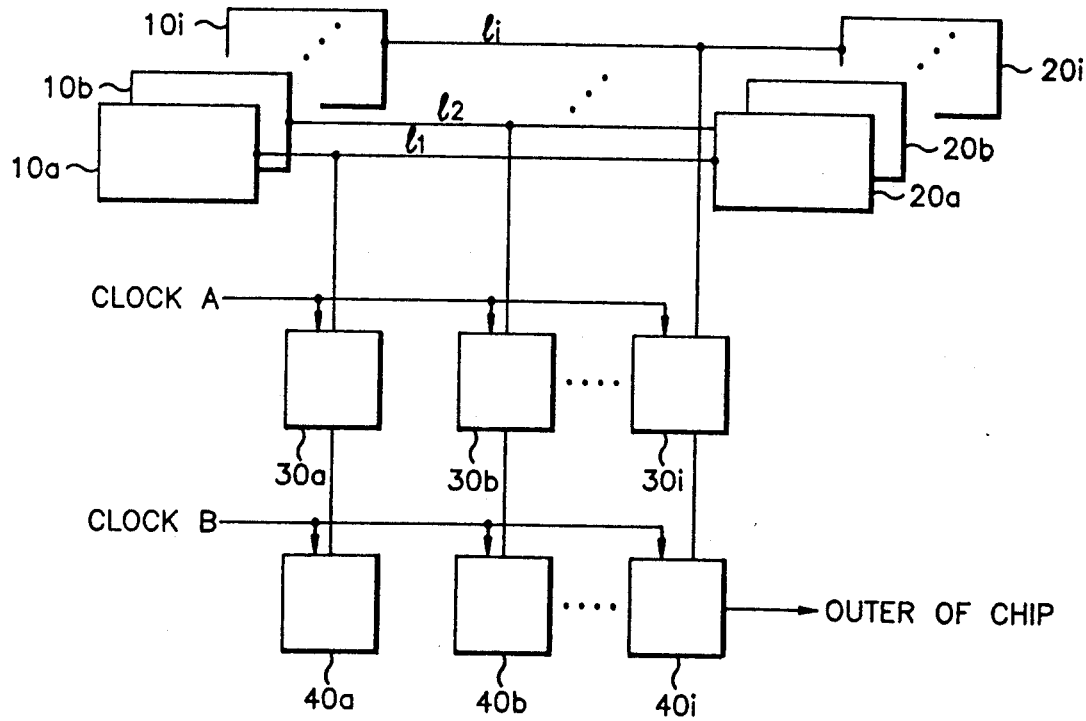
FIG. 2 shows a block diagram illustrating an internal signal detector according to the present invention.

Referring to FIG. 2, a plurality of latch circuits 30a to 30i are arranged in parallel to one another and connected to a plurality of transmission lines $l_1$ to $l_i$, which extend from the first signal generators 10a to 10i to the second signal generators 20a to 20i, where predetermined signals are generated from the first and second signal generators. A plurality of shift registers 40a to 40i are connected to the latch circuits 30a to 30i. A clock A controls the latch circuits 30a to 30i and determines the latched time of the voltages applied to the transmission lines $l_1$ to $l_i$. A clock B, as a signal supplied from the outside of a chip, controls the shift registers 40a to 40i. The voltages latched onto the latch circuits 30a to 30i are sequentially produced to the outside of the chip through the shift registers 40a to 40i. Therefore, the shift registers 40a to 40i can read the latched voltages by the clock B, bit by bit.

Figure 3:
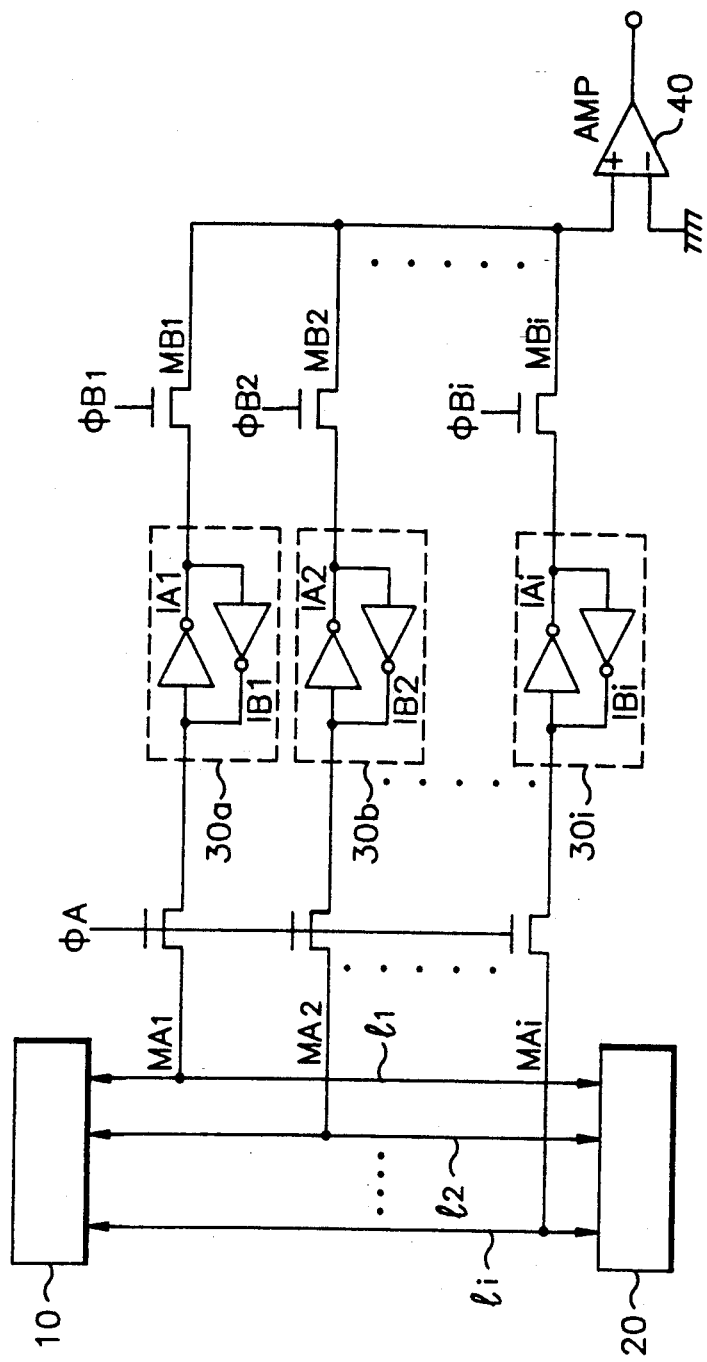
FIG. 3 shows an embodiment of FIG. 2.

Referring to FIG. 3, the internal signal detecting circuit included in a semiconductor memory device having the first and second signal generators 10 and 20, has a plurality of first transfer transistors $MA_1$ to $MA_i$, a plurality of latch circuits 30a to 30i and a plurality of second transfer transistors $MB_1$ to $MB_i$, and a differential operation amplifier 40. the first and second signal generators are connected to each other by a plurality of transmission lines $l_1$ to $l_i$. The first transfer transistors $MA_1$ to $MA_i$ are connected to the transmission lines $l_1$ to $l_i$ through one stages of channels thereof, respectively. And the first transfer transistors $MA_1$ to $MA_i$ are operated by a first control signal $\phi A$. The latch circuits 30a to 30i are connected through input stages thereof to the other stages of the channels of the first transfer transistors $MA_1$ to $MA_i$. The latch circuits latch the voltages applied to the transmission lines $l_1$ to $l_i$. The second transfer transistors $MB_1$ to $MB_i$ are connected, through one stages of channels thereof, to the output stages of the latch circuits 30a to 30i, and are operated by second control signals $\phi B_1$ to $\phi B_i$. In brief, the first transfer transistors are serially connected to the second transfer transistors through the latch circuits, respectively. The shift register 40 is connected through an input stage thereof to the other stages of the channels of the second transfer transistors $MB_1$ to $MB_i$. And the shift register 40 produces the voltages latched to the latch circuits 30a to 30i, into the outside of a chip. In the above construction, the first and second transfer transistors $MA_1$ to $MA_i$ to $MB_1$ to $MB_i$ employ NMOS transistors. The function of the circuit in accordance with the above construction as shown in FIG. 3 is the same as that of FIG. 2.

Figure 4:
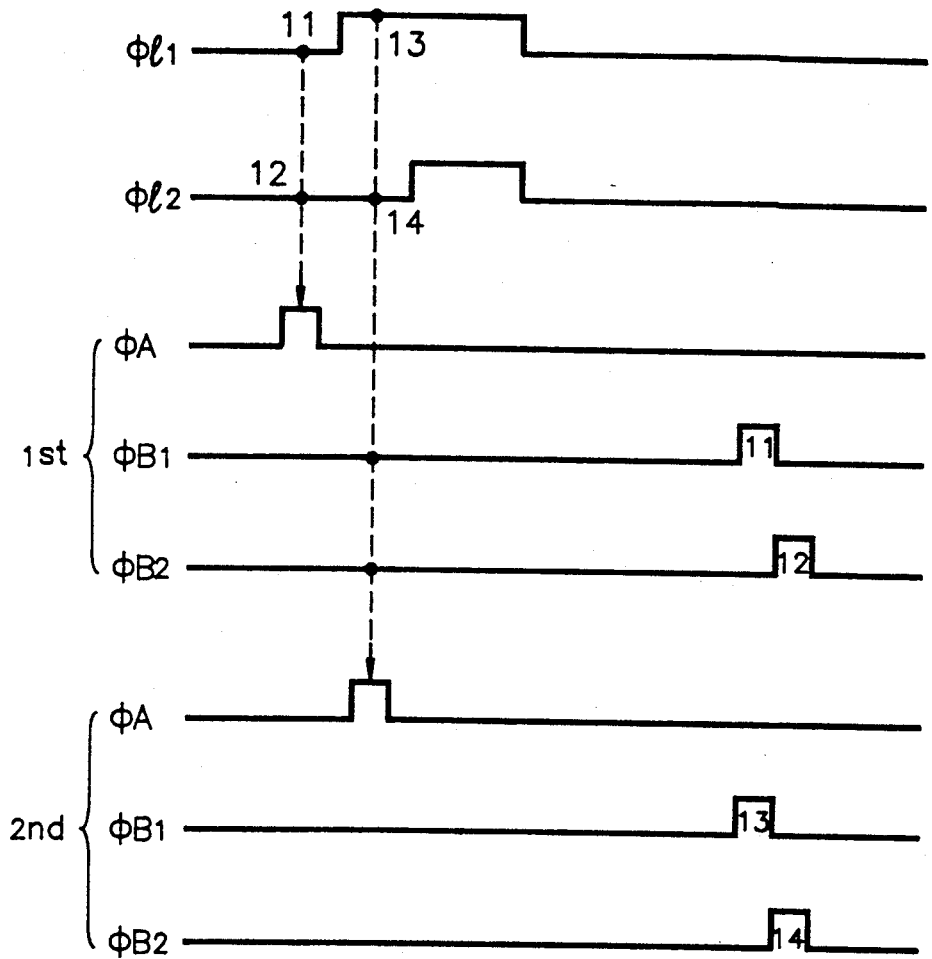
FIG. 4 shows a timing diagram of FIG. 3 during the debugging operation.

The operational characteristic of FIG. 3 will be described with reference to FIG. 4 illustrating the debugging timing. It should be noticed that the second control signals $\phi B_1$ to $\phi B_i$, with a given time interval, are applied sequentially to the second transfer transistors $MB_1$ to $MB_i$.

The signals of the first and second signal generators are applied to the transmission lines $l_1$ to $l_i$, respectively. The first control signal $\phi_A$ of a logic "high" state is applied to the first transfer transistors $MA_1$ to $MA_i$, turning on the first transfer transistors $MA_1$ to $MA_i$. Then the signals $\phi l_1$ to $\phi l_i$ in transmission lines $l_1$ to $l_i$ are latched onto the latch circuits $30a$ to $30i$ through the channels of the first transfer transistors $MA_1$ to $MA_i$. Thereafter, in dependence upon the sequential application of the second control signals $\phi B_1$ to $\phi B_i$ to the second transfer transistors $MB_1$ to $MB_i$, the differential operational amplifier 40 sequentially receives each signal of the latch circuits through the channels of the second transfer transistors $MB_1$, to $MB_i$, to produce the signals $\phi l_1$ to $\phi l_i$ to the outside of the chip. For instance, in case the signals $\phi l_1$ and $\phi l_2$ of transmission lines $l_1$ and $l_2$ are of logic "low" state; and if the first control signal $\phi A$ is enabled, the signals $\phi l_1$ and $\phi l_2$ are transferred to the latch circuits $30a$ and $30b$, and latched thereunto. Then if the supplying of the first control signal $\phi A$ is stopped and the second control signals $\phi B_1$ and $\phi B_2$ are sequentially of logic "high" states, the latched signals onto the latch circuits $30a$ and $30b$ are sequentially transferred to the register 40, through the channels of the second transistors $MB_1$ and $MB_2$. The output of the differential operational amplifier 40 is successively transferred to the outside of the chip. Accordingly, it can be detected whether signals from the differential operational amplifier 40 are the same as initial signals of transmission lines $l_1$ and $l_2$ or not. Similarly, the spot, where signal $l_1$ has a voltage of a logic "high" state, and signal $l_2$ is logic "low" state, can be easily found, only if the time interval of the first and second control signals is controlled so that the first control signal $\phi A$ is enabled and the second control signals $\phi l_1$ and $\phi l_2$ are consecutively disabled after the signals $\phi l_1$ and $\phi l_2$ of logic "low" states are completely transferred to the latch circuits $30a$ and $30b$. Also the spot, where the signals $\phi l_1$ and $\phi l_2$ are logic "high" states can be detected. As a result, by using the internal signal detector comprised of the latch circuits and register, the defects of the first and second signal generating circuits 10 and 20 can be easily detected at outside of the chip.

Therefore, the defects of the circuit in the chip can be easily checked by using a monitor, etc., for example. Further, the internal signal detector is suitably laid out on a vacant space, in the chip by in parallel, connecting an internal signal detector to the any transmission lines applied to a predetermined signal.

In the circuit of FIG. 3, first and second control signals $\phi A$, $\phi B$ as one predetermined voltage and the sequentially generated voltage by using a delay circuit, are supplied from the inside or the outside of the chip. The first and second control signals can be easily applied to the first and second transfer transistors, respectively. Moreover, the latch circuits and shift register can be adjusted in appropriate number according to the layout of the chip.

As described above, the defects of the internal signal can be detected within a short time. Therefore, when, because of a complication of an internal circuit, it is difficult to know the operation of each circuit signal thereof, the internal signal detector according to the present invention is effective as if the probing is performed on a PCB (Printed Circuit Board) by analyzing data.

While the invention has been particularly shown and described with reference to the preferred embodiment of the present invention thereof, it will be understood by those skilled in the art that the foregoing and other changes in form and details may be made without departing from the spirit and scope of the present invention.

What is claimed is:

1. An internal signal detector for use in a semiconductor memory device, comprising:

first signal generator means for generating an internal signal in said semiconductor memory device;

second signal generator means connected to said first signal generator means by a plurality of transmission lines;

a plurality of latch circuits respectively connected to sad plurality of transmission lines, for latching a voltage applied to each transmission line of said plurality of transmission lines to produce a latched voltage; and a plurality of shift registers respectively connected to said plurality of latch circuits, for transferring the latched voltage to an outside source from said semiconductor memory device to enable detection of potential characteristics of said latched voltage representative of defective elements in said semiconductor memory device.

2. The internal detector as claimed in claim 1, wherein said plurality of latch circuits are controlled by a clock signal for making a determination of a latching time of said latched voltage.

3. The internal signal detector as claimed in claim 1, wherein said shift registers sequentially transfer said latched voltage to said outside source of said semiconductor memory device in dependence upon a control signal.

4. The internal signal detector as claimed in claim 3, wherein said control signal is an external signal from said semiconductor memory device for sequentially enabling read operations of said latched voltage from said plurality of latch circuits.

5. An internal signal detector of a semiconductor memory device, having a first signal generator and a second signal generator, which are connected to each other by a transmission line, said internal signal detector comprising:

a first transfer transistor connected to said transmission of an internal signal generated from said first and second signal generators in response to a first control signal to provide a first transferred signal;

a latch circuit connected to said first transistor, for latching a voltage of said first transferred signal from said transmission line to provide a latched signal;

a second transfer transistor for enabling transmission of said latched signal in response to a second control signal to provide a second transferred signal; and means connected to said second transfer transistor, for transferring the second transferred signal to an outside source of said semiconductor memory device to enable detection of potential characteristics of said second transferred signal representative of defective elements in said semiconductor memory device.

6. The internal signal detector as claimed in claim 5, wherein said first transfer transistor is a N type metal-oxide-semiconductor transistor interposed between said first signal generator and said second signal generator.

7. The internal signal detector as claimed in claim 5, wherein said first control signal is a latch clock supplied from one of an inside source and said outside source of said semiconductor memory device for making a determination of a latching time of the voltage applied to said transmission line.

8. The internal signal detector as claimed in claim 5, wherein said second transfer transistor is a N type metal-oxide-semiconductor transistor connected serially to said first transfer transistor via said latch circuit.

9. The internal signal detector as claimed in claim 5, wherein said second control signal is supplied from the outside source of aid semiconductor memory device, and is used for sequentially producing the voltage latched onto said latch circuit.

10. The internal signal detector as claimed in claim 5, wherein said means for transferring said second transferred signal is a differential operational amplifier having a first terminal coupled to receive the voltage latched onto said latch circuit, and a second terminal coupled to ground.

11. A semiconductor memory device having a plurality of signal generators, each being connected to each other through a transmission line, comprising:
an internal signal detector having at least one latch circuit and at least one shift register, for detecting existence of any defects of said signal generators through said at least one latch circuit connected to the transmission line and through said at least one shift register, said at least one shift register being connected to said at least one latch circuit respectively for sequentially producing a voltage applied from said transmission line indicative of the detected defect of said signal generators.

12. The semiconductor memory device as claimed in claim 11, further comprising a first NMOS transistor interposed between a first one of said plurality of signal generators and a second one of said plurality of signal generators.

13. The semiconductor memory device as claimed in claim 12, wherein aid first NMOS transistor enables transmission of the voltage applied from said transmission line indicative of the detected defects of said signal generators in dependence upon a latch clock supplied from one of an inside source and an outside source of said semiconductor memory device after a determination of a latching time of the voltage applied from said transmission line of said at least one latch circuit.

14. The semiconductor memory device as claimed in claim 12, further comprising a second NMOS transistor connected serially to said first NMOS transistor via said latch circuit.

15. The semiconductor memory device as claimed in claim 14, wherein said second NMOS transistor sequentially produces the voltage latched onto said latch circuit in dependence upon a control signal supplied from an outside source of said semiconductor memory device.

16. The semiconductor memory device as claimed in claim 11, further comprising a differential operational amplifier having a first terminal coupled to receive the voltage latched onto said latch circuit, and a second terminal coupled to ground, for transferring the voltage applied from said transmission line indicative of the detected defect of said signal generators.

17. A semiconductor memory device, comprising:
a plurality of signal generators for generating a plurality of internal signals through a plurality of internal transmission lines; and
an internal signal detector for detecting existence of defects of said semiconductor memory device by determining voltages from said plurality of signal generators by comprising:
a plurality of first transfer transistors respectively connected to said plurality of transmission lines, for enabling transmission of a selected internal signal in dependence upon a first control signal to provide a transmitted internal signal;
a plurality of latch circuits, each having connected to each of said plurality of first transfer transistors, for latching a voltage of said transmitted internal signal to provide a latched signal;
a plurality of second transfer transistors respectively connected to each output terminal of said plurality of latch circuits, for enabling transmission of said latched signal in dependence upon a second control signal to provide a transmitted latch signal; and
means for transferring the transmitted latched signal to an exterior of said semiconductor memory device to enable detection of potential characteristics of said transmitted latched signal representative of defective elements of said semiconductor memory device.

18. The semiconductor memory device as claimed in claim 17, said first control signal is a latch clock supplied from one of an inside source and an outside source of said semiconductor memory device, for making a determination of a latching time of the voltage of said transmitted internal signal.

19. The semiconductor memory device as claimed in claim 17, wherein said second control signal is supplied from an outside source of said semiconductor memory device, for enabling said plurality of second transfer transistors to sequentially transmit said latched signal.

20. The semiconductor memory device as claimed in claim 17, wherein said transferring means is a differential operational amplifier.

* * * * *

UNITED STATES PATENT AND TRADEMARK OFFICE
CERTIFICATE OF CORRECTION

PATENT NO. : 5,265,051
DATED : 23 November 1993
INVENTOR(S) : Kyoung-Seob Jeong

It is certified that error appears in the above-indentified patent and that said Letters Patent is hereby corrected as shown below:

Column 1,

Line 42,    delete "transmission", and before "lines", insert --transmission--;

Line 49,    after "probes", insert --1--;

IN THE CLAIMS

Column 5,

Line 20,    change "aid" to --said--;

UNITED STATES PATENT AND TRADEMARK OFFICE
CERTIFICATE OF CORRECTION

PATENT NO. : 5,265,051
DATED : 23 November 1993
INVENTOR(S) : Kyoung-Seob Jeong

It is certified that error appears in the above-indentified patent and that said Letters Patent is hereby corrected as shown below:

Column 6,

Line 29,    after "having", insert --an input terminal--.

Signed and Sealed this

Twentieth Day of September, 1994

Attest:

BRUCE LEHMAN

Attesting Officer      Commissioner of Patents and Trademarks